United States Patent
Milner et al.

(10) Patent No.: US 6,193,526 B1
(45) Date of Patent: Feb. 27, 2001

(54) WIRING UNIT WITH ANGLED INSULATION DISPLACEMENT CONTACTS

(75) Inventors: John J. Milner, Milford; Joseph E. Dupuis, Mystic; Richard A. Fazio, Old Lyme; Robert A. Aekins, Branford, all of CT (US)

(73) Assignee: Hubbell Incorporated

( * ) Notice: Subject to any disclaimer, the term of this patent is extended or adjusted under 35 U.S.C. 154(b) by 0 days.

(21) Appl. No.: 09/250,186

(22) Filed: Feb. 16, 1999

(Under 37 CFR 1.47)

(51) Int. Cl.[7] .................................................. H01R 12/00
(52) U.S. Cl. .......................... 439/76.1; 439/676; 439/404
(58) Field of Search ................................... 439/76.1, 404, 439/405, 676, 395

(56) References Cited

U.S. PATENT DOCUMENTS

| | | |
|---|---|---|
| 4,600,810 | 7/1986 | Feldman et al. . |
| 4,975,078 | 12/1990 | Stroede et al. . |
| 5,078,609 | 1/1992 | Bouchan et al. . |
| 5,118,310 * | 6/1992 | Stroede et al. ........................ 439/676 |
| 5,186,647 | 2/1993 | Denkmann et al. . |
| 5,228,872 | 7/1993 | Liu . |
| 5,376,018 | 12/1994 | Davis et al. . |
| 5,403,200 * | 4/1995 | Chen .................................... 439/404 |
| 5,414,393 | 5/1995 | Rose et al. . |
| 5,432,484 | 7/1995 | Klas et al. . |
| 5,580,270 | 12/1996 | Pantland et al. . |
| 5,586,914 | 12/1996 | Foster, Jr. et al. . |
| 5,628,647 | 5/1997 | Rohrbaugh et al. . |
| 5,647,770 | 7/1997 | Belopolsky . |
| 5,700,167 | 12/1997 | Pharney et al. . |
| 5,716,237 | 2/1998 | Conorich et al. . |
| 5,905,637 * | 5/1999 | Su ........................................ 439/676 |
| 5,947,772 * | 9/1999 | Arnett et al. ......................... 439/676 |
| 5,967,801 * | 10/1999 | Martin et al. ....................... 439/76.1 |

FOREIGN PATENT DOCUMENTS

| | | |
|---|---|---|
| 2242080 | 9/1991 | (GB) . |
| 2273397 | 6/1994 | (GB) . |
| 2322741 | 9/1998 | (GB) . |
| 9605635 | 2/1996 | (WO) . |

OTHER PUBLICATIONS

Hubbell Premise Wiring, Inc. Full Line Catalog #1100R.

* cited by examiner

Primary Examiner—Paula Bradley
Assistant Examiner—Katrina Davis
(74) Attorney, Agent, or Firm—Jerry M. Presson; Mark S. Bicks; Alfred N. Goodman

(57) ABSTRACT

A wire connecting unit for an electrical connector includes a printed circuit board and four pairs of terminals. The printed circuit board has nose and termination areas, and a wire receiving passageway extending along an axis in the termination area. Contact connections are mounted in the nose area. Terminal connections are mounted in the termination area. Conductive paths on the circuit board electrically couple respective contact connections and terminal connections. Each of the terminals has a coupling portion mechanically and electrically coupled through one of the terminal connections, and has an insulation displacement contact portion. Each insulation displacement contact portion is adjacent the wire receiving passageway and extends in a plane oriented at an acute angle to the passageway axis.

22 Claims, 4 Drawing Sheets

WIRING UNIT WITH ANGLED INSULATION DISPLACEMENT CONTACTS

REFERENCE TO RELATED APPLICATION

This application is related to U.S. patent application Ser. No. 09/250,187, filed concurrently herewith in the names of John J. Milner, Richard A. Fazio, and Robert A. Aekins, and entitle Wiring Unit With Pair In-Line Insulation Displacement Contacts, the subject matter of which is hereby incorporated by reference.

FIELD OF THE INVENTION

The present invention relates to a wiring unit for an electrical connector or an electrical connector with a wiring unit. The wiring unit has insulation displacement contacts for electrically and mechanically connecting insulated wires to the connector. More particularly, the present invention relates to orienting the insulation displacement contacts at acute angles to the wiring unit passageway receiving wires arranged in unshielded twisted pairs for telecommunication and data transmission wiring systems.

BACKGROUND OF THE INVENTION

Due to significant advancements in telecommunications and data transmission speeds over unshielded twisted pair cables, the connectors (jacks, patch panels, cross connects, etc.) have become critical factors in achieving high performance in data transmission systems, particularly at the higher frequencies. Some performance characteristics, particularly near end crosstalk, can degrade beyond acceptable levels at new, higher frequencies in the connectors unless adequate precautions are taken.

Often, wiring is pre-existing. Standards define the geometry and the pin definitions for the connectors, making any changes to the wiring and to the connector geometry and pin definitions for improving performance characteristics cost prohibitive.

The use of unshielded twisted pair wiring and the establishment of certain standards for connector geometry and pin definitions were created prior to the need for high speed data transmissions. Thus, while using the existing unshielded twisted pair wiring and complying with the existing standards, connectors must be developed that fulfill the performance requirements of today's higher speed communications, in order to maintain compatibility with the existing connectors.

Conventional connectors of this type are disclosed in U.S. Pat. No. 4,975,078 to Stroede, U.S. Pat. No. 5,186,647 to Denkmann et al, U.S. Pat. No. 5,228,872 to Liu, U.S. Pat. No. 5,376,018 to Davis et al, U.S. Pat. No. 5,580,270 to Pantland et al, U.S. Pat. No. 5,586,914 to Foster et al and U.S. Pat. No. 5,628,647 to Roharbaugh et al, the subject matter of each of which is hereby incorporated by reference.

SUMMARY OF THE INVENTION

An object of the present invention is to provide a wiring unit for an electrical connector or an electrical connector with insulation displacement contacts with improved performance characteristics, but without shielding and without changing standard connector geometry and pin definitions.

Another object of the present inventions is to provide a wiring unit for an electrical connector and an electrical connector which is simple and inexpensive to manufacture and use.

A further object of the present invention is to provide a wiring unit for an electrical connector and an electrical connector with insulation displacement contacts arranged to facilitate installation of the wires into the contacts and to reduce the necessary bend angle in the wires.

The foregoing objects are basically obtained by a wire connecting unit for an electrical connector comprising a printed circuit board and four pairs of terminals. The printed circuit board has first and second areas and a wiring receiving passageway extending along an axis in the second area. Contact connections are mounted in the first area. Terminal connections are mounted in the second area. Conductive paths on the circuit board electrically couple respective contact connections and terminal connections. The terminals are arranged in first, second, third and fourth pairs. Each of the terminals has a coupling portion mechanically and electrically connected to one of the terminal connections, and has a insulation displacement contact portion. Each contact portion is adjacent the wiring receiving passageway and extends in a plane oriented at an acute angle to the passageway axis.

By forming the wire connecting unit for the electrical connector in this manner, the connector will have improved performance characteristics, without shielding and without changing the standard connector geometry and pin definitions. By being at an acute angle to the wire receiving passageway axis, the contacts can be situated in distinct pairs which further enhances the electrical performance. Additionally, the angular orientation allows the wires to be bent along radius of curvature which is greater and at a generally obtuse angle, rather than 90 degree angle. This change in the wire bend also proves electrical performance, particularly in connection with near end crosstalk.

The angled terminal orientation maximizes spacing in both directions, increasing efficiency in the termination process. The spacing enables wire lacing into a pretermination position to allow quicker termination. The offsetting of the terminals resulting from the angular orientation allows the wires to be oriented side-by-side in the same plane both before and after termination. Such planar orientation increases termination efficiency by enabling the overall termination to be visually observed for correctness directly from above the termination.

Other objects, advantages and salient features of the present invention will become apparent from the following detailed description, which, taken in conjunction with the annexed drawings, discloses preferred embodiments of the present invention.

BRIEF DESCRIPTION OF THE DRAWINGS

Referring to the drawings which form a part of this disclosure.

DETAILED DESCRIPTION OF THE PREFERRED EMBODIMENTS

Figure 1:
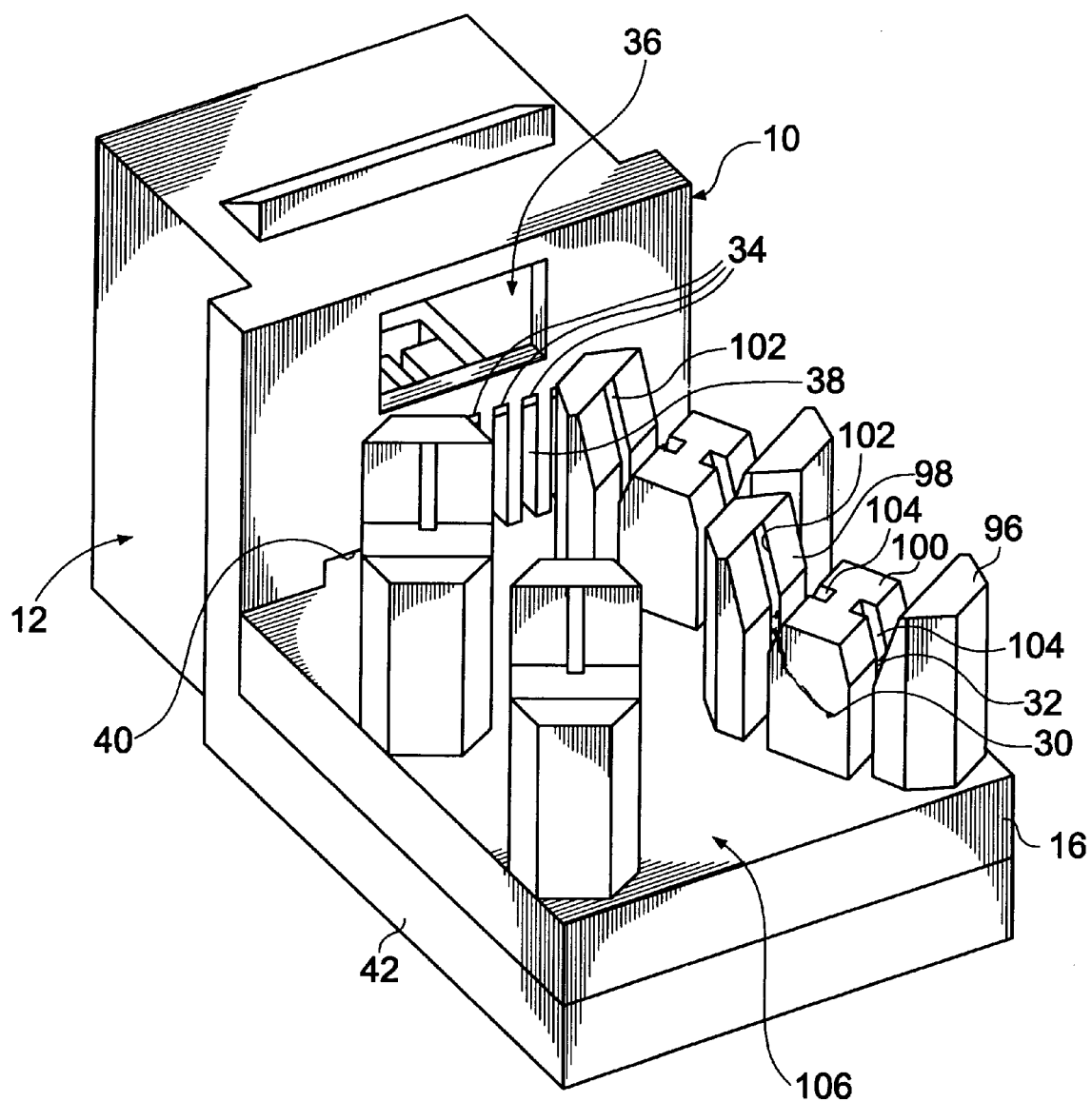
FIG. 1 is a diagrammatic perspective view of a high density jack for a telecommunication system according to a first embodiment of the present invention.
Figure 2:
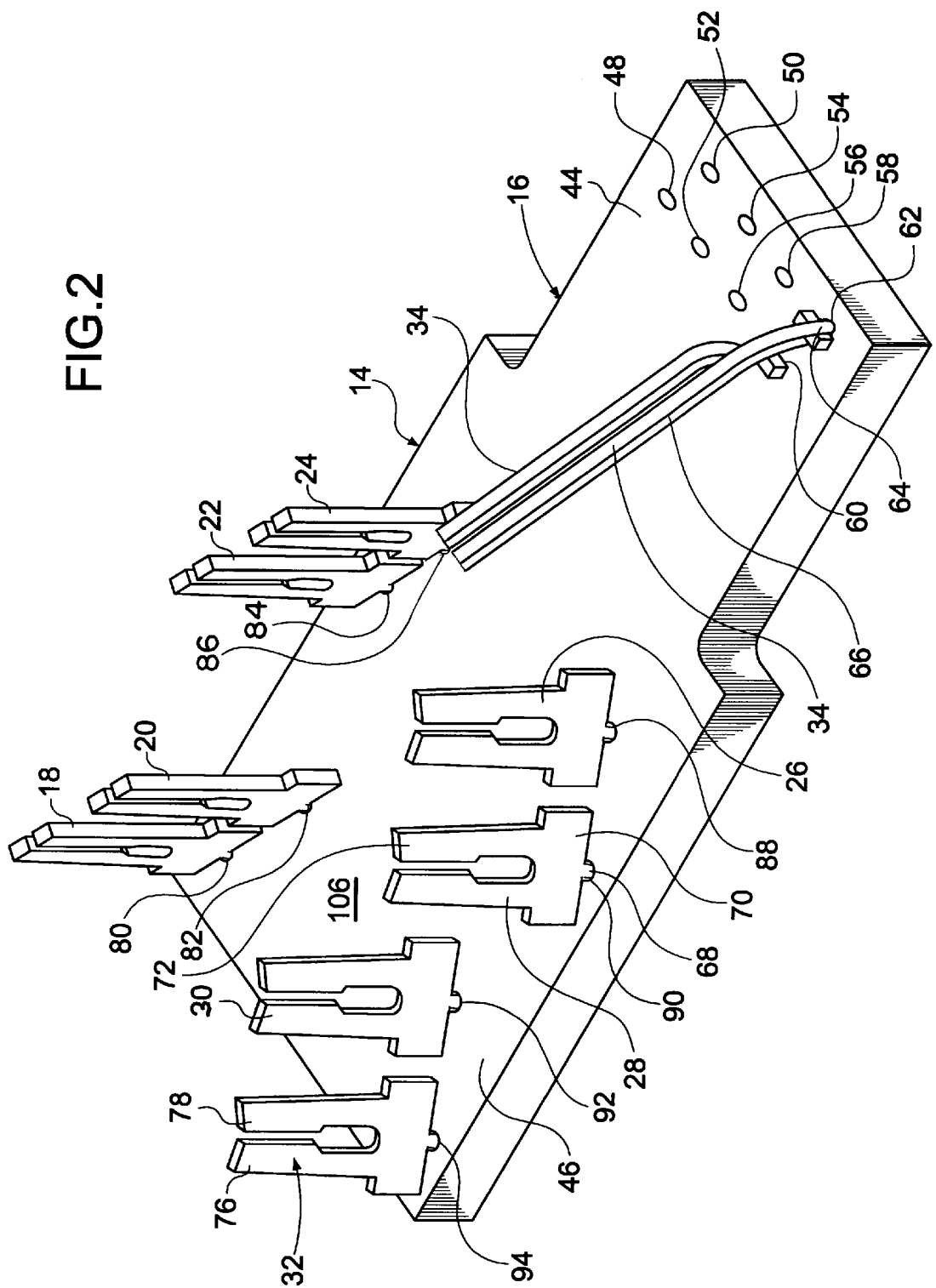
FIG. 2 is a perspective view of the wire connecting unit for the electrical connector of FIG. 1, with only some of the electrically conductive contacts mounted therein and without the insulating members for the terminals.

A high density jack 10 for telecommunication systems according to the present invention is schematically or diagrammatically illustrated in FIGS. 1 and 2. The connector comprises a connector body 12 and a wire connecting unit 14 coupled to the connector body. The wiring unit comprises a printed circuit board 16 on which four pairs of terminals 18, 20, 22, 24, 26, 28, 30 and 32 are mounted. Through the circuit board, these terminals are electrically and mechanically coupled to resilient contacts 34. The resilient contacts extend into the connector body in the standard configuration for electrical connection to a plug, particularly an RJ plug.

In the illustrated embodiment, connector body 12 is in a form to form a jack. However, the connector body can be of any desired form, such as a plug, cross connect or any other connector in the telecommunications or data transmission field.

Connector body 12 is generally hollow having a forwardly opening cavity 36 for receiving a conventional RJ plug. Eight parallel slots 38 extend through the connector body and open on its rear face. One resilient contact 34 is located in each of the slots.

Below slots 38, i.e., on the side of the slots remote from plug receiving cavity 36, the connector body has a recess 40. Recess 40 opens on the rear face of connector body 12 and is adapted to receive a portion of circuit board 16, specifically the portion of the circuit board on which the resilient contacts 34 are mounted. A shelf 42 can extend rearwardly from the connector body below recess 40. Shelf 42 supports circuit board 16 and facilitates the coupling between the circuit board and the connector body.

Printed circuit board 16 is divided into a relatively narrower nose or first area 44 and a relatively wider termination or second area 46. Nose area 44 comprises eight holes or contact connections 48, 50, 52, 54, 56, 58, 60 and 62. Each of the holes is internally plated with an electrically conductive material, as conventionally done in this art. The holes can be arranged in two rows of four each, which rows are laterally offset from one another, as illustrated. Alternatively, the arrangement of the holes can be modified (e.g. using three rows) to accommodate higher frequencies. Each of the holes is provided for mounting one of the resilient contacts 34.

Each resilient contact 34 comprises a base portion 64 and a contact portion 66. The base portions are received and are electrically connected to the holes. The contact portions extend in a cantilever manner from the based portions and are bent at an angle for receipt within slots 38 of connector body 12. In this manner, the holes provide connections in the circuit board for the resilient contacts 34.

The terminals 18, 20, 22, 24, 26, 28, 30 and 32 are standard 110 insulation displacement contacts (IDC). Each terminal comprises a lower coupling portion 68, a middle portion 70 connected to and extending from the coupling portion and an insulation displacement contact portion 72 extending from the middle portion, such that middle portion connects the coupling portion and the contact portion. Each contact portion has a slot 74 to define legs 76 and 78.

The shape of the resilient contacts and the IDC terminals can be modified to enhance electrical performance.

To mount terminals 18, 20, 22, 24, 26, 28, 30 and 32 on circuit board 16, the circuit board is provided with respective openings or terminal connections 80, 82, 84, 86, 88, 90, 92 and 94. Specifically, terminal 18 is mounted in opening 80; terminal 20 is mounted in opening 82; terminal 22 is mounted in opening 84; terminal 24 is mounted in opening 86; terminal 26 is mounted in opening 88; terminal 28 is mounted in opening 90; terminal 30 is mounted in opening 92; and terminal 32 is mounted in opening 94.

Like the first area holes, the terminal area openings or terminal connections are internally plated with conductive material to mechanically and electrically engage coupling portion 68 of the respective terminal.

Each of the terminals, particularly the contact portions thereof, are generally planer. Additionally, the terminals are arranged in pairs with the terminals of each pair being coplanar. Specifically, terminals 18 and 20 form a first coplanar pair; terminals 22 and 24 form a second coplanar pair; terminals 26 and 28 form a third coplanar pair; and terminals 30 and 32 form a fourth coplanar pair.

To support and protect the terminals and to avoid inadvertent electrical contact, the middle portion and contact portion of each terminal are supported with insulating members 96, 98 and 100 extending upwardly from the surface of the circuit board. For each terminal pair, two end insulating members 96 and 98 and one center insulating member 100 are provided. End insulating members 96 and 98 face and are either side of center insulating member 100. The upper portions of end insulating members 96 and 98 have upwardly and outwardly slanted surfaces. Similarly, the upper end of center member 100 is tapered with upwardly and inwardly slanted surfaces. In this manner, inlet areas tapering downwardly are provided which lead to the terminals. The sides of the terminals are located within slots 102 in the end members and the slots 104 in the center member. The slots extend the entire length of each insulating member.

As illustrated in FIG. 1, four separate sets of insulating members are provided, with each set being provide for one pair of the terminals. The four sets of insulating members define a wire receiving passageway 106. The twisted pairs of wires from the system wiring or cables are placed in and extend within passageway 106 for connection to respective terminals.

Figure 3:
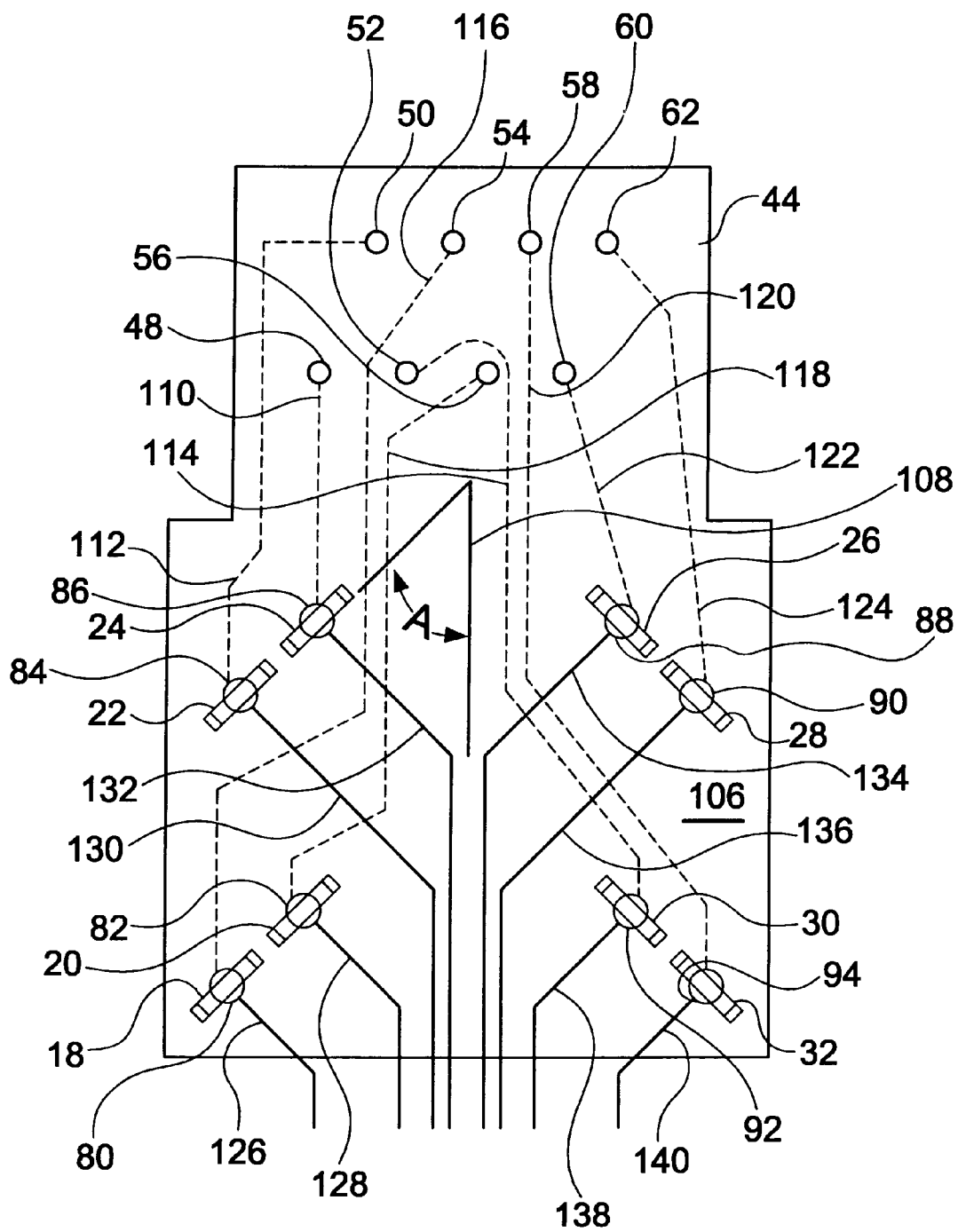
FIG. 3 is a diagrammatic plan view of the wiring connecting unit for the electrical connector FIG. 1.

As illustrated in FIG. 3, passageway 106 extends along an axis 108. The passageway extends along its axis from the end of the circuit board remote from connector body 12 to the junction of nose and termination areas 44 and 46 of circuit board 16.

As illustrated in FIG. 3 contact connection holes 48, 50, 52, 54, 56, 58, 60 and 62 are electrically coupled to terminal connection openings 86, 84, 92, 80, 82, 94, 88 and 90, respectively, by conductive traces 110, 112, 114, 116, 118, 120, 122 and 124, respectively. Trace 110 extends between and electrically couples hole 48 and opening 86. Trace 112 extends between and electrically couples hole 50 and opening 84. Trace 114 extends between and electrically couples 52 and opening 92. Trace 116 extends between and electrically couples hole 54 and opening 80. Trace 118 extends between and electrically connects hole 56 and opening 82. Trace 120 extends between and electrically connects hole 58 and opening 94. Trace 122 extends between and electrically connects 60 and opening 88. Trace 124 extends between and electrically couples hole 62 and opening 90. In this manner, the traces connect the terminals to respective resilient contacts through the respective holes and openings.

The traces are only illustrated graphically and are not intended to depict a specific length, shape or relative orientation. The traces can be adapted to employ noise reduction techniques such as those disclosed in U.S. Pat. No. 5,432, 484 to Klas et al, U.S. Pat. No. 5,414,393 to Rose et al and U.S. Pat. No. 5,618,185 to Aekins, the subject matter of each patent is hereby incorporated by reference.

As illustrated in the figures, particularly FIG. 3, each pair of terminals is oriented in a plane at an acute angle to axis 108 of passageway 106. Preferably, this acute angle is preferably, in the range of about 20 to about 50 degrees, and is most preferably substantially 30 degrees.

In connecting wires 126, 128, 130, 132, 134, 136, 138 and 140 to terminals 18, 20, 22, 24, 26, 28, 30 and 32, respectively, each wire initially passes and is oriented along axis 108. The wire is then bent along a curve at an obtuse angle for connection to the respective insulation displacement terminal. In this manner, only a bend of the wire at an obtuse angle is required, rather than an 90 degree bend as required in conventional connectors. Additionally, the system provides better electrical performance, facilitates manipulation of the wires for placing them within the appropriate respective terminal, and permits and facilitates visual inspection of the wiring connections.

According to the first embodiment, each pair of terminals is equally spaced from axis 108. This facilitates the appropriate electrical balance for the system. Additionally, the first pair of terminals 18 and 20 and the second pair of terminals 22 and 24 are located on one side of the passageway 106, while the third pair of terminals 26 and 28 and the fourth pair of terminals 30 and 32 are located on the opposite side of the passageway. The second and third pair of terminals are located adjacent nose area 44, while first and fourth pair of terminals are located remote from nose area 44. The end of the passageway remote from the nose area is the region of wiring unit 14 through which the wires can be initially fed for connection to the terminals.

Figure 4:
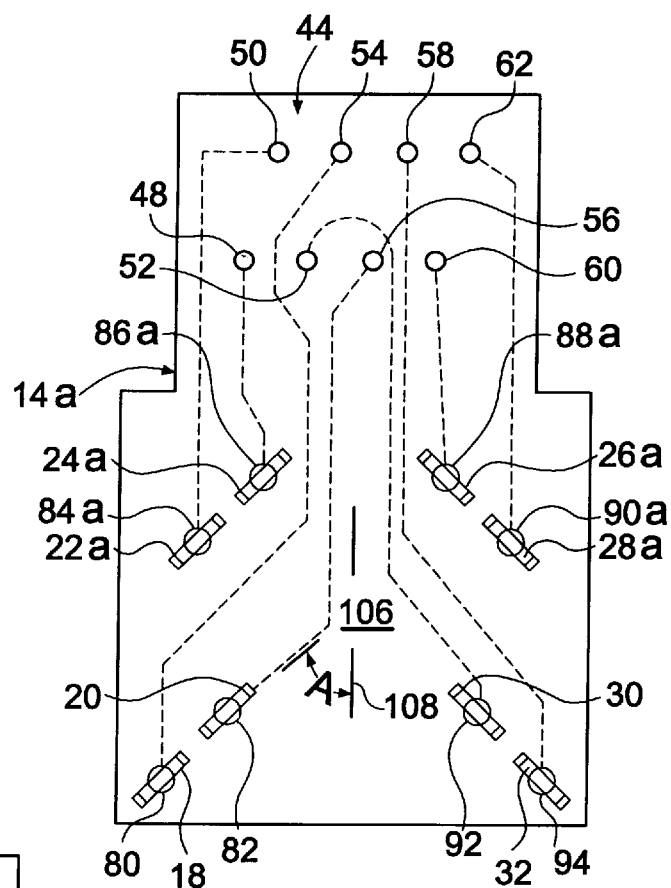
FIG. 4 is a diagrammatic plan view of a wire connecting unit according to a second embodiment of the present invention.
Figure 5:
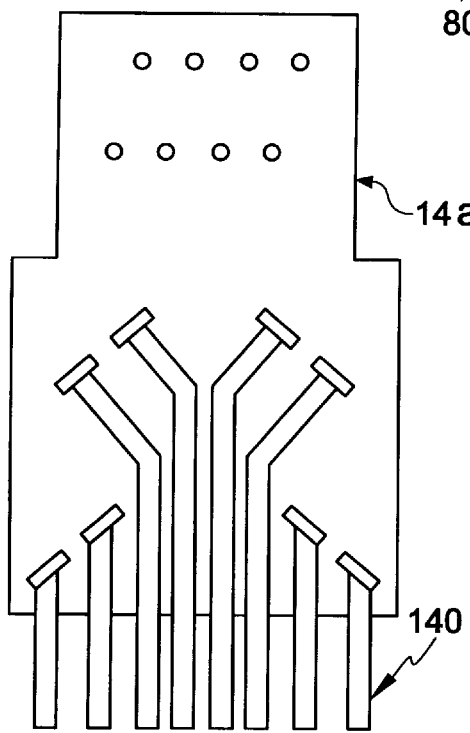
FIG. 5 is a diagrammatic plan view of the wire connecting unit of FIG. 4 with wires graphically shown connected thereto.

FIGS. 4 and 5 disclose a second embodiment of the present invention. In the illustrations of the second embodiment, features which are identical to those of the first embodiment are identified like reference numbers. Different parts are identified with the addition of the letter "a". The second embodiment differs from the first embodiment only in the location of the second and third pairs of terminals. Specifically, the second and third pairs of terminals are located closer to axis 108 of passageway 106 then the first and fourth pairs of terminals. The nose area holes of the second embodiment are identical to the nose area holes of the first embodiment. Additionally, terminals 18, 20, 30 and 32 and the openings therefor are positioned and located as discussed above for the first embodiment.

Terminals 22a and 24a of the second and their openings 84a and 86a are spaced laterally inwardly closer to axis 108, and thus, are laterally offset from first pair terminals 18 and 20. Similarly, third pair terminals 26a and 28a and their respective openings 88a and 90a are spaced inwardly closer to axis 108 and are laterally offset from terminals 30 and 32 and openings 92 and 94 for the fourth pair. Although this orientation changes the balance of the connectors somewhat, it provides a easier connection of the wires and a smaller amount of bend necessary for the connecting wires, as particularly illustrated in FIG. 5.

While various embodiments have been chosen to illustrate the invention, it will be understood by those skilled in the art that various changes and modifications can be made therein without departing from the scope of the invention as defined in the appended claims.

What is claim is:

1. A wire connecting unit for an electrical connector, comprising;
   a printed circuit board having first and second areas and a wire receiving passageway extending along an axis in said second area;
   contact connections mounted in said first area;
   terminal connections mounted in said second area;
   conductive paths on said circuit board electrically coupling the respective contact connections and terminal connections; and
   first, second, third and fourth pairs of terminals, each of said terminals having a coupling portion mechanically and electrically connected to one of said terminal connections and having an insulation displacement contact portion, each said contact portion being adjacent said wire receiving passageway and extending in a plane oriented at an acute angle to said axis.

2. A wire connecting unit according to claim 1 wherein said contact portions of each said pair are essentially coplanar.

3. A wire connecting unit according to claim 2 wherein said first and second pairs are located on one side of said passageway; and
said third and fourth pairs are located on another side of said passageway.

4. A wire connecting unit according to claim 3 wherein said wire receiving passageway has a first longitudinal end adjacent said first area and a second longitudinal end remote from said first area through which wires can be initially fed;
said second and third pairs are located adjacent said first end; and
said first and fourth pairs are located adjacent said second end.

5. A wire connecting unit according to claim 4 wherein said first and fourth pairs are located closer to said axis than said second and third pairs.

6. A wire connecting unit according to claim 4 wherein each of said pair are located substantially equally distant from said axis.

7. A wire connecting unit according to claim 1 wherein said contact portions are housed in insulating members extending from a surface of said circuit board.

8. A wire receiving unit according to claim 7 wherein said insulating members define said wire receiving passageway therebetween.

9. A wire receiving unit according to claim 1 wherein electrically conductive contacts are coupled to and extend from said contact connections.

10. A wire receiving unit according to claim 1 wherein said acute angle is between about 20 and 50 degrees.

11. A wire receiving unit according to claim 10 wherein said acute angle is about 30 degrees.

12. An electrical connector, comprising;
a connector body;
a printed circuit board, coupled to said connector body, and having first and second areas and a wire receiving passageway extending along an axis in said second area;
contact connections mounted in said first area;
terminal connections mounted in said second area;
conductive paths on said circuit board electrically coupling the respective contact connections and terminals connections; and
first, second, third and fourth pairs of terminals, each of said terminals having a coupling portion mechanically and electrically connected to one of said terminal connections and having an insulation displacement contact portion, each said contact portion being adjacent said wire receiving passageway and extending in a plane oriented at an acute angle to said axis.

13. An electrical connector according to claim 12 wherein said contact portions of each said pair are essentially coplanar.

14. An electrical connector according to claim 13 wherein
said first and second pairs are located on one side of said passageway; and
said third and fourth pairs are located on another side of said passageway.

15. An electrical connection according to claim 14 wherein
said wire receiving passageway has a first longitudinal end adjacent said first area and a second longitudinal end remote from said first area through which wires can be initially fed;
said second and third pairs are located adjacent said first end; and
said first and fourth pairs are located adjacent said second end.

16. An electrical connector according to claim 15 wherein said first and fourth pairs are located closer to said axis than said second and third pairs.

17. An electrical connector according to claim 15 wherein each of said pair are located substantially equally distant from said axis.

18. An electrical connector according to claim 12 wherein said contact portions are housed in insulating members extending from a surface of said circuit board.

19. An electrical connector according to claim 18 wherein said insulating members define said wire receiving passageway therebetween.

20. An electrical connector according to claim 12 wherein electrically conductive contacts are coupled to extend from said contact terminals into said connector body.

21. An electrical connector according to claim 20 wherein said acute angle is between about 20 and 50 degrees.

22. An electrical connector according to claim 21 wherein said acute angle is about 30 degrees.

* * * * *